(12) United States Patent
Ishimaru

(10) Patent No.: US 6,627,528 B1
(45) Date of Patent: Sep. 30, 2003

(54) SEMICONDUCTOR DEVICE AND ITS MANUFACTURING PROCESS

(75) Inventor: Kazunari Ishimaru, Yokohama (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 9 days.

(21) Appl. No.: 09/650,901

(22) Filed: Aug. 30, 2000

(30) Foreign Application Priority Data

Aug. 31, 1999 (JP) .............................. 11-246575

(51) Int. Cl.[7] ................ H01L 21/3205; H01L 21/4763; H01L 29/76
(52) U.S. Cl. ..................... 438/596; 438/231; 438/239; 438/258; 438/275; 438/597; 257/368; 257/393; 257/903
(58) Field of Search ................. 438/596, 257, 438/258, 239, 275, 231, 216–218, 222, 225, 597

(56) References Cited

U.S. PATENT DOCUMENTS

| | | | |
|---|---|---|---|
| 5,602,049 A | | 2/1997 | Wen et al. |
| 6,001,689 A | * | 12/1999 | Van Buskirk et al. ...... 438/266 |
| 6,184,083 B1 | * | 2/2001 | Tsunashima et al. ........ 438/257 |
| 6,376,351 B1 | * | 4/2002 | Tsai ........................... 438/592 |

* cited by examiner

Primary Examiner—Matthew Smith
Assistant Examiner—Igwe U. Anya
(74) Attorney, Agent, or Firm—Pillsbury Winthrop LLP

(57) ABSTRACT

Gate electrodes in an inverter section and a transfer section are formed only on element areas, and connected to each other by means of local interconnection layers. As a result, a memory cell of a very small size but a large capacity can be formed without considering a gate fringe or shortening phenomenon problem.

33 Claims, 13 Drawing Sheets

SEMICONDUCTOR DEVICE AND ITS MANUFACTURING PROCESS

CROSS-REFERENCE TO RELATED APPLICATIONS

This application is based upon and claims the benefit of priority from the prior Japanese Patent Application No. 11-246575, filed Aug. 31, 1999, the entire contents of which are incorporated herein by reference.

BACKGROUND OF THE INVENTION

This invention relates to the formation of an element-isolating area and a gate electrode, and more particularly to a semiconductor device used as a memory cell, and its manufacturing process.

FIG. 31 shows an example of a conventional SRAM memory cell array. This figure only shows element-isolating areas 64a, element areas 64b, gate electrodes 66a and local interconnection layers 70a. A process for manufacturing a unit memory cell section 59 will be described.

First, as shown in FIG. 32, an insulating film 61 is formed on a semiconductor substrate 60, and a nitride film 62, for example, which is used as a stopper during polishing a filling material, is formed on the insulating film 61.

Subsequently, as shown in FIG. 33, a patterned resist 63 is formed on the nitride film 62. Using the resist 63 as a mask, the nitride film 62, the insulating film 61 and the semiconductor substrate 60 are selectively etched by anisotropic etching, thereby forming an element-isolating trench 64. The etching of the semiconductor substrate 60 is not limited to that using the resist 63 as a mask. For example, the pattern of the resist 63 may be copied on the nitride film 62, thereby etching the semiconductor substrate 60 using the nitride film 62 as a mask. Then, the resist 63 is removed and oxidation is executed.

After that, as shown in FIG. 34, an oxide film 65, for example, is formed on the entire surface of the resultant structure, thereby filling the element-isolating trench 64 with the oxide film 65.

Then, as shown in FIG. 35, the oxide film 65 is etched by dry etching or CMP (Chemical Mechanical Polishing), so as to expose the top surface of the nitride film 62.

Thereafter, as shown in FIG. 36, the nitride film 62 and the oxide film 65 are removed to form the element-isolating area 64a. Then, ion implantation is executed for forming a well or a channel, and the insulating film 61 is removed.

As shown in FIG. 37, a gate insulating film 61a is newly formed on the semiconductor substrate 60. A polysilicon film 66, which will be formed into gate electrodes, is formed on the gate insulating film 61a. On the polysilicon film 66, a patterned resist 67 is formed.

Subsequently, the polysilicon film 66 is etched using the resist 67 as a mask. As a result, gate electrodes 66a are formed as shown in FIG. 38, followed by the removal of the resist 67.

As is shown in FIG. 39, an interlayer insulating film 68 is formed on the entire surface of the resultant structure, and a pattern resist (not shown) is formed on the interlayer insulating film 68. The interlayer insulating film 68 is etched, using the resist as a mask, thereby providing local interconnection layer forming sections 69. After that, a metal film 70 is formed on the entire surface, thereby filling the interconnection layer forming sections 69. The metal film 70 is then etched to expose the top surface of the interlayer insulating film 68. Thus, the local interconnection layers 70a are formed. FIG. 40 is a plane view of the structure shown in FIG. 39. Further, FIG. 41 is a cross sectional view taken along line 41—41 of FIG. 40.

In the above-described conventional technique, the patterned resist 67 is formed as shown in FIG. 37 when forming the gate electrodes 66a for MOS transistors. FIG. 42 is a plane view of the structure shown in FIG. 37.

As is shown in FIG. 42, the resist 67 is formed on an inverter section 65a and a transfer section 65b. At this time, it is necessary to pattern the resist 67 in consideration of any possible misalignment from an underlayer pattern (e.g. the element areas 64b) of lithography process. Accordingly, a so-called fringe F1 serving as an allowance for misalignment is provided, resist 67 is designed rectangle of pattern length L1.

However, where the resist 67 to be exposed must be made to have a small size in accordance with the development of the element refining technique, the resist 67 cannot be patterned as desired. For example, as is shown in FIGS. 42 and 43, even if the resist 67 is tried to be formed into the rectangle of pattern length L1, a resist pattern 67a with a length of as short as L2 is formed. When such a shortening phenomenon occurs, the fringe becomes shorter from F1 to F2, and it is possible that the resist pattern 67a will be smaller than a required minimum pattern which includes an allowance for misalignment. In this case, normal transistor operation cannot be executed.

To solve the above problem, there is a process for elongating the length F1 of the fringe by the amount of shortening when patterning the resist 67. However, if the fringe is elongated, the entire cell inevitably enlarges. Accordingly, when realizing a memory cell array of a large capacity, the chip size inevitably enlarges.

A process for reducing a gate electrode space S1 could be used as a process for increasing the length F1 of the fringe without increasing the cell size. However, if the resolution limit is exceeded as a result of reducing S1, electrodes to be isolated from each other (for example, an electrode 66a in the inverter section 65a and a electrode 66a in the transfer section 65b shown in FIG. 40) will be connected. This also disables the normal transistor operation.

As described above, the conventional gate electrode forming process and memory cell structure makes it very difficult to realize a minute memory cell of a large capacity.

BRIEF SUMMARY OF THE INVENTION

The present invention has been developed to solve the above-described problem, and aims to provide a semiconductor device, which includes a minute memory cell of a large capacity, and is free from a gate fringe or shortening phenomenon problem, and also can provide a process for manufacturing the semiconductor device.

To attain the aim, the present invention uses the following means.

The semiconductor device of the invention comprises element areas formed in a semiconductor substrate; an element-isolating area that isolates the element areas from each other; and a plurality of gate electrodes formed only on each of the element areas.

Further, the semiconductor device of the invention comprises element areas formed in a semiconductor substrate; an element-isolating area that isolates the element areas from each other; and a plurality of gate electrodes formed only on each of the element areas; a first local wire connecting the gate electrodes to each other; and a second local wire connecting the element areas to each other.

Furthermore, the semiconductor device of the invention comprises element areas formed in a semiconductor substrate; an element-isolating area that isolates the element areas from each other; and a plurality of gate electrodes formed only on each of the element areas; a first local wire connecting the gate electrodes to each other; a second local wire connecting the element areas to each other; a plurality of third local wires that are each formed only on a corresponding one of the element areas and do not connect the gate electrodes or the element areas; and a wire connecting the third local wires.

Also, the semiconductor device of the invention comprises element areas formed in a semiconductor substrate; an element-isolating area that isolates the element areas from each other; a plurality of gate electrodes formed only on the element areas; a first local wire connecting the gate electrodes to each other; a plurality of second local wires each formed on a corresponding one of the element areas, the second local wires connecting no gate electrode or no element areas; and a wire connecting the second local wires.

The semiconductor device of the invention may further comprise side walls formed on side surfaces of the gate electrodes.

Preferably, the semiconductor device of the invention further comprises low density diffusion areas formed in those surface portions of each of the element areas, which are overlap respective lower edge portions of the gate electrodes, and high density diffusion areas having a higher impurity concentration than the low density diffusion areas and formed in surface portions of the element areas in contact with the low density diffusion areas.

More preferably, the semiconductor device of the invention further comprises a silicide film formed on the gate electrodes and the element areas.

It is desirable that the element-isolating area should have a trench structure.

Also preferably, the gate electrodes is formed of a material different from the material of the first and second local wires.

Preferably, the second local wire is thicker than the gate electrodes.

The present invention also provides a process of manufacturing a semiconductor device comprising the steps of: forming a gate insulating film on a semiconductor substrate; forming a gate electrode material on the gate insulating film; forming an element-isolating area in the semiconductor substrate for isolating element areas from each other; forming a patterned resist on the gate electrode material; selectively removing the gate electrode material, using the resist as a mask, thereby forming a plurality of gate electrodes only on those portions of the gate insulating film, which are located on the element areas; removing the resist; forming an interlayer film on an entire surface of a resultant structure; and forming local wires in the interlayer film for connecting the gate electrodes to each other and the element areas to each other.

The present invention provides a process of manufacturing a semiconductor device comprising the steps of: forming a gate insulating film on a semiconductor substrate; forming a dummy gate material on the gate insulating film; forming an element-isolating area in the semiconductor substrate for isolating element areas from each other; forming a patterned resist on the dummy gate material; selectively removing the dummy gate material, using the resist as a mask, thereby forming a plurality of dummy gates only on those portions of the gate insulating film, which are located on the element areas; removing the resist; forming a first interlayer film on an entire surface of a resultant structure; flattening the first interlayer film to expose top surfaces of the dummy gates; removing the dummy gates to form openings; implanting ions through the openings; forming a gate electrode material on an entire surface of a resultant structure and filling the openings; selectively removing the gate electrode material to expose a top surface of the first interlayer film and form gate electrodes in the openings; forming a second interlayer film on an entire surface of a resultant structure; and forming local wires in the second interlayer film for connecting the gate electrodes to each other and the element areas to each other.

Preferably, the process of the invention further comprises the step of forming side walls on side surfaces of the gate electrodes.

Preferably, the process of the invention further comprises the steps of: forming low density diffusion areas in those surface portions of each of the element areas, which are overlap respective lower edge portions of the gate electrodes; and forming high density diffusion areas, which have a higher impurity concentration than the low density diffusion areas, in surface portions of the element areas in contact with the low density diffusion areas.

More preferably, the process of the invention 11, further comprises the step of forming a silicide film on the gate electrodes and the element areas.

Also preferably, the process of the invention further comprises the steps of: removing, after ion implantation, the gate insulating film from a bottom of each of the openings to expose top surface portions of the semiconductor substrate; and forming again an insulating film on the exposed surface portions of the semiconductor substrate.

As described above, the present invention can provide a semiconductor device, which includes a minute memory cell of a large capacity and is free from a gate fringe or shortening phenomenon problem, and also can provide a process for manufacturing the semiconductor device.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

The embodiments of the invention will be described with reference to the accompanying drawings.

First Embodiment

Figure 1:
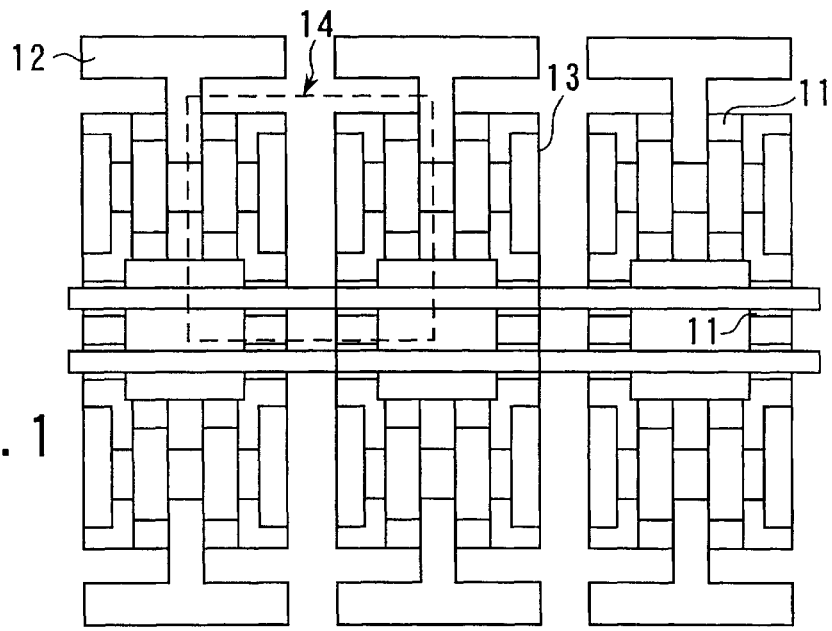
FIG. 1 is a plane view showing an SRAM memory cell array according to the invention.
Figure 2:
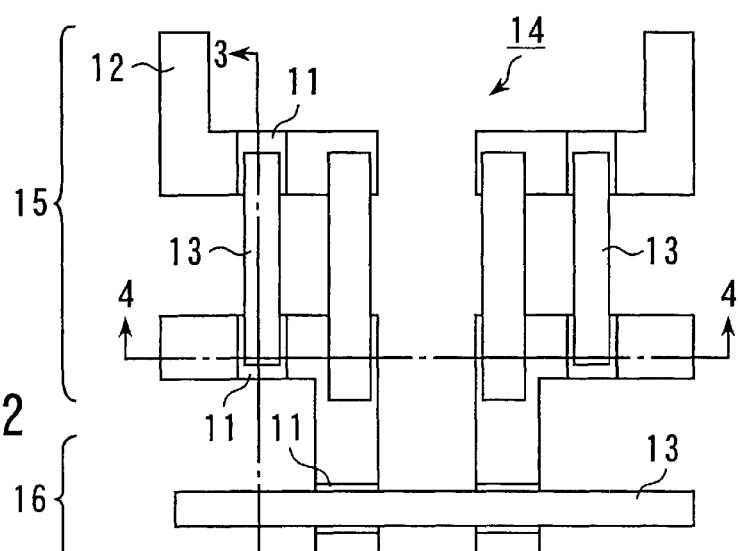
FIG. 2 is a plane view showing a unit memory cell according to the invention.

FIG. 1 shows a case where a first embodiment of the invention is applied to an SRAM memory cell array. FIG. 2 is an enlarged view of a unit memory cell appearing in FIG. 1.

As is shown in FIGS. 1 and 2, the first embodiment is characterized in that gate electrodes 11 included in an inverter section 15 and a transfer section 16 are formed on only element areas 12, and are connected to each other by local interconnection layers 13.

Figure 3:
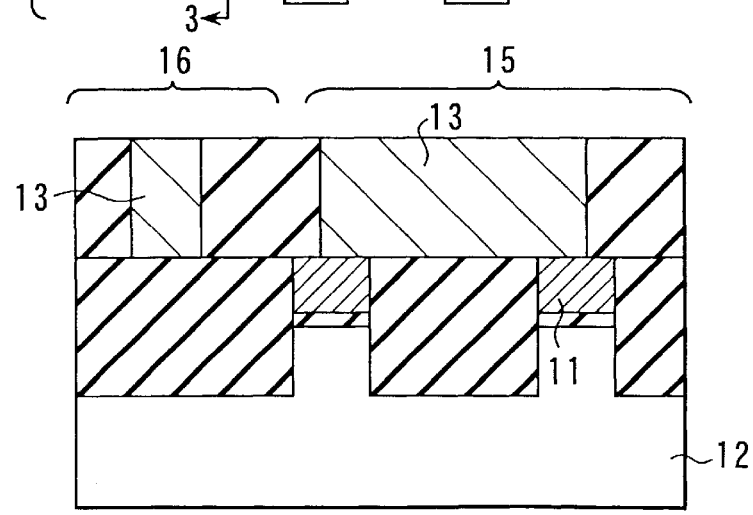
FIG. 3 is a cross sectional view taken along line 3—3 of FIG. 2, showing a semiconductor device according to the invention.
Figure 4:
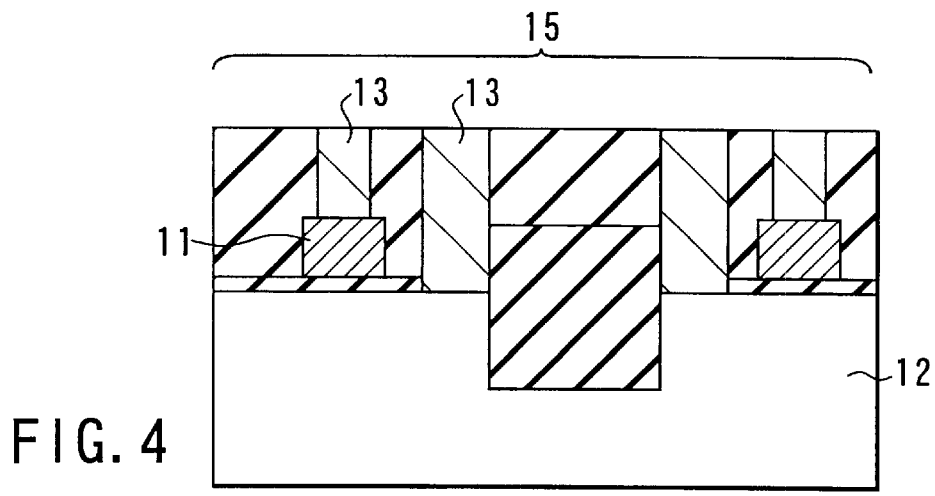
FIG. 4 is a cross sectional view taken along line 4—4 of FIG. 2, showing the semiconductor device according to the invention.

FIG. 3 is a cross sectional view taken along line 3—3 of FIG. 2. FIG. 4 is a cross sectional view taken along line 4—4 of FIG. 2. As is shown in FIGS. 3 and 4, the gate electrodes 11 are formed only on the element areas 12. Further, the local interconnection layers 13 connect the element areas 12 of the inverter section 15 to the element areas 12 of the transfer section 16, and serve as wire-leading sections.

Referring to FIGS. 5 to 20, a description will be given of a process for manufacturing a semiconductor device according to a first embodiment of the invention.

Figure 5:
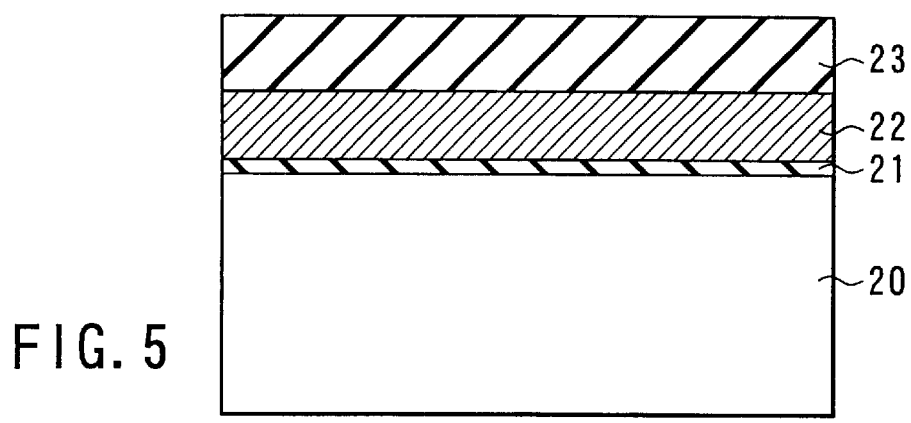
FIG. 5 is a cross sectional view showing a process step of manufacturing a semiconductor device according to a first embodiment of the invention.

First, as shown in FIG. 5, a gate insulating film 21 is formed on a semiconductor substrate 20, and a polysilicon film 22, which will serve as gate electrodes, is formed on the gate insulating film 21. A mask material 23 used for etching is provided on the polysilicon film 22. It is sufficient to use, as the mask material 23, a material that provides a reliable selective ratio for etching the semiconductor substrate 20 to form an element-isolating trench, which will be described later. For example, an oxide film or a nitride film is used as the mask film.

Figure 6:
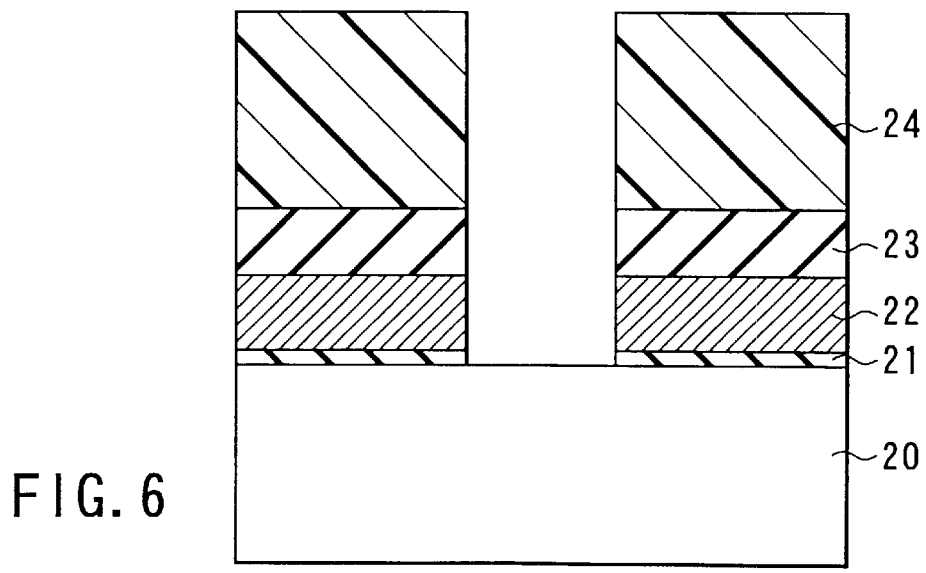
FIG. 6 is a cross sectional view showing the next process step, after the step of FIG. 5, of manufacturing the semiconductor device according to the first embodiment of the invention.

After that, as shown in FIG. 6, a patterned resist 24 is formed on the mask material 23. Anisotropic etching is executed using the resist 24 as a mask, thereby removing part of the mask material 23, the polysilicon film 22 and the gate insulating film 21, and exposing part of the semiconductor substrate 20. Then, the resist film 24 is removed.

Figure 7:
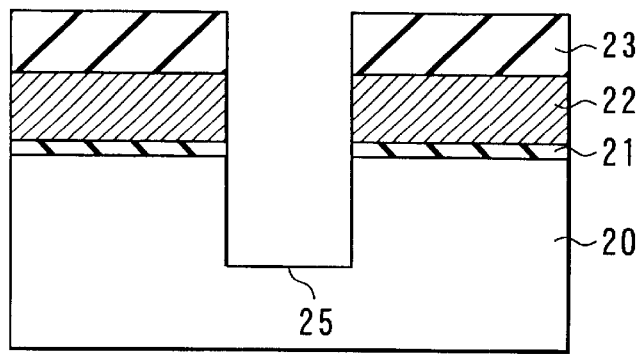
FIG. 7 is a cross sectional view showing the next process step, after the step of FIG. 6, of manufacturing the semiconductor device according to the first embodiment of the invention.

Subsequently, as shown in FIG. 7, the mask material 23 is used as a mask to etch part of the semiconductor substrate 20 to a certain depth, which is necessary for forming element separating areas described later. As a result, an element-isolating trench 25 is formed. Although, in this embodiment, the element-isolating trench 25 is formed after removing the resist 24, the invention is not limited to this. For example, the element-isolating trench 25 may be formed using the resist 24. The process for forming the element-isolating trench 25 does not influence the advantages of the present invention.

Figure 8:
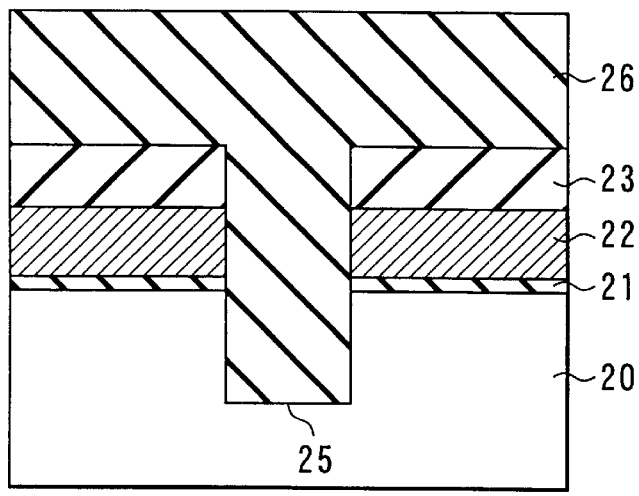
FIG. 8 is a cross sectional view showing the next process step, after the step of FIG. 7, of manufacturing the semiconductor device according to the first embodiment of the invention.

After that, as shown in FIG. 8, an insulating film 26 is formed on the entire surface of the resultant structure, and the element-isolating trench 25 is filled with the film 26.

Although, in this embodiment, the insulating film 26 is formed immediately after the formation of the element-isolating trench 25, using the oxidation process such as thermal oxidation etc. an oxide film may be formed on the surface of the element-isolating trench 25 before the formation of the insulating film 26. This oxidation process does not influence the advantages of the invention.

Figure 9:
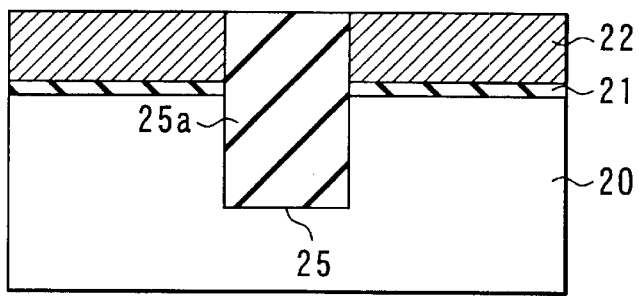
FIG. 9 is a cross sectional view showing the next process step, after the step of FIG. 8, of manufacturing the semiconductor device according to the first embodiment of the invention.

After that, as shown in FIG. 9, the insulating film 26 and the mask material 23 are etched, thereby exposing the top surface of the polysilicon film 22. The insulating film 26 and the mask material 23 may be removed by, for example, CMP (Chemical Mechanical Polishing), dry etching, etc. It suffices if the insulating film 26 and the mask material 23 are removed and the exposed polysilicon film 22 has a flat surface. Thus, an element-isolating area 25a of an STI (Shallow Trench Isolation) is formed.

Figure 10:
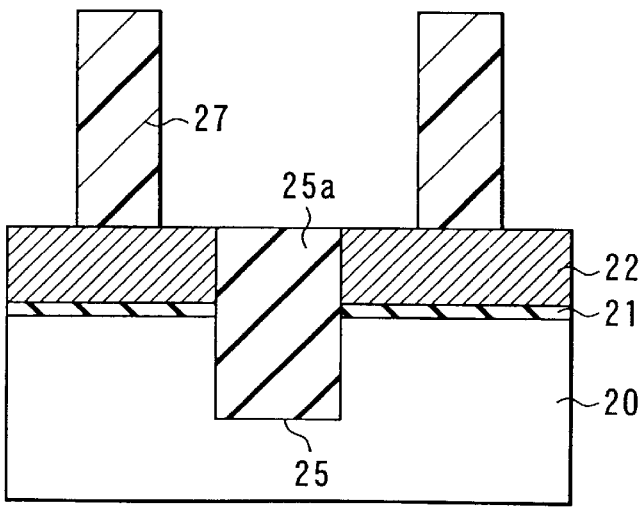
FIG. 10 is a cross sectional view showing the next process step, after the step of FIG. 9, of manufacturing the semiconductor device according to the first embodiment of the invention.
Figure 11:
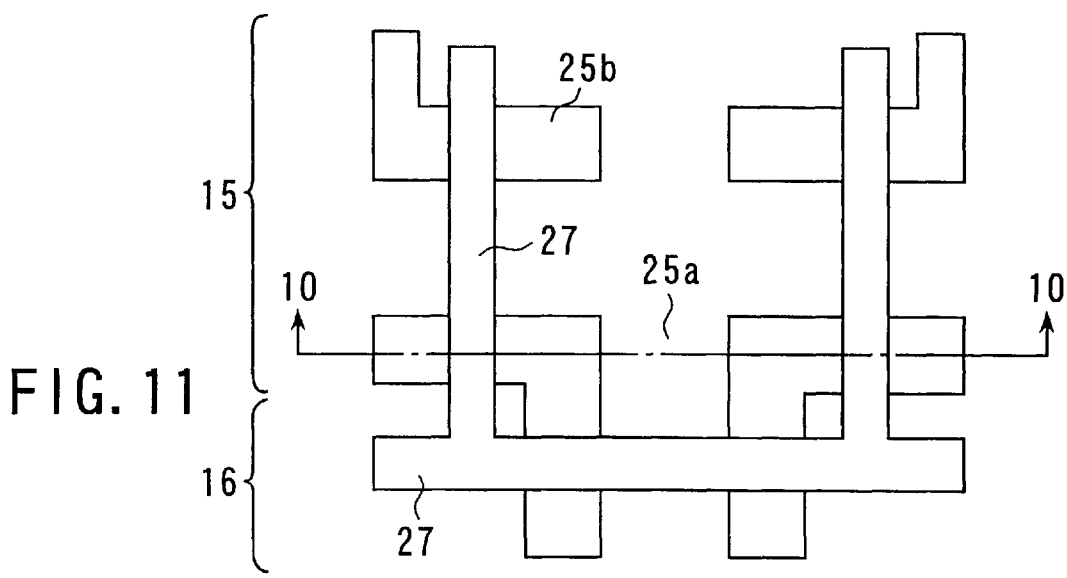
FIG. 11 is a plane view of the structure shown in FIG. 10, useful in explaining the manufacturing step of FIG. 10.

Then, as shown in FIG. 10, a patterned resist 27 is formed on the polysilicon film 22 by lithography. FIG. 10 is a cross sectional view taken along line 10—10 of FIG. 11. As is shown in FIG. 11, the resist 27 is continuously formed on the inverter section 15 and the transfer section 16.

Figure 12:
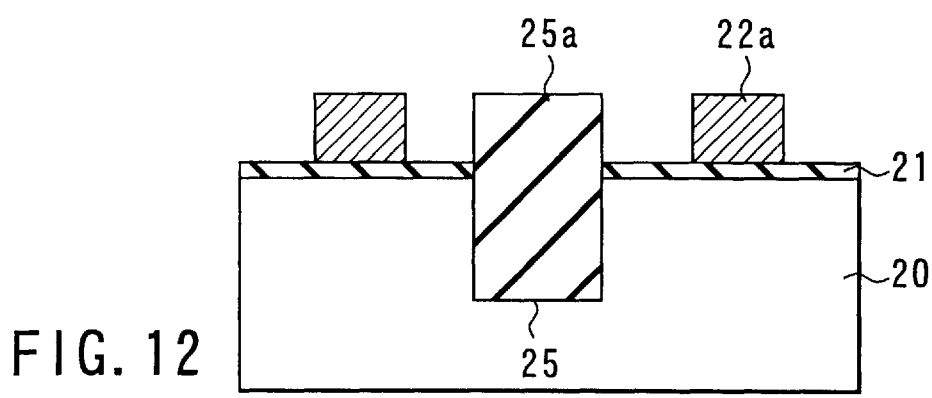
FIG. 12 is a cross sectional view showing the next process step, after the step of FIG. 10, of manufacturing the semiconductor device according to the first embodiment of the invention.
Figure 13:
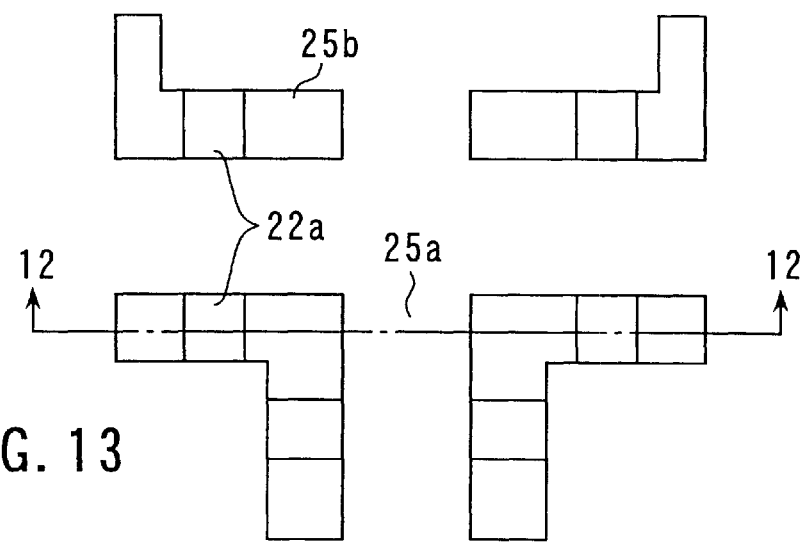
FIG. 13 is a plane view of the structure in FIG. 12, useful in explaining the manufacturing step of FIG. 12.

As shown in FIG. 12, the polysilicon film 22 is etched using the resist 27 as a mask, thereby forming gate electrodes 22a. FIG. 12 is a cross sectional view taken along line 12—12 of FIG. 13. As shown in FIG. 13, the gate electrodes 22a are formed only on the element areas 25b.

Figure 14:
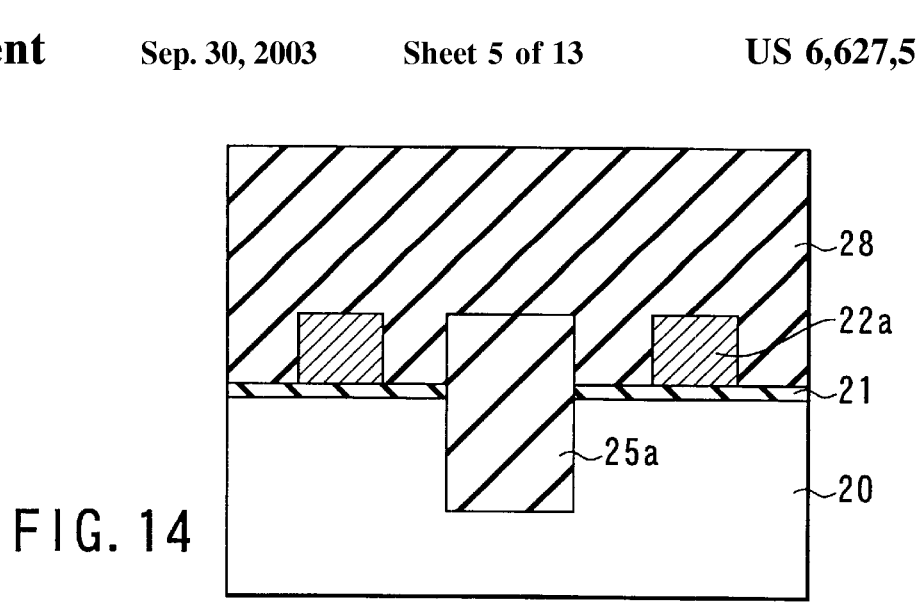
FIG. 14 is a cross sectional view showing the next process step, after the step of FIG. 12, of manufacturing the semiconductor device according to the first embodiment of the invention.

Subsequently, as shown in FIG. 14, an interlayer insulating film 28 is formed on the entire surface of the resultant structure.

Figure 15:
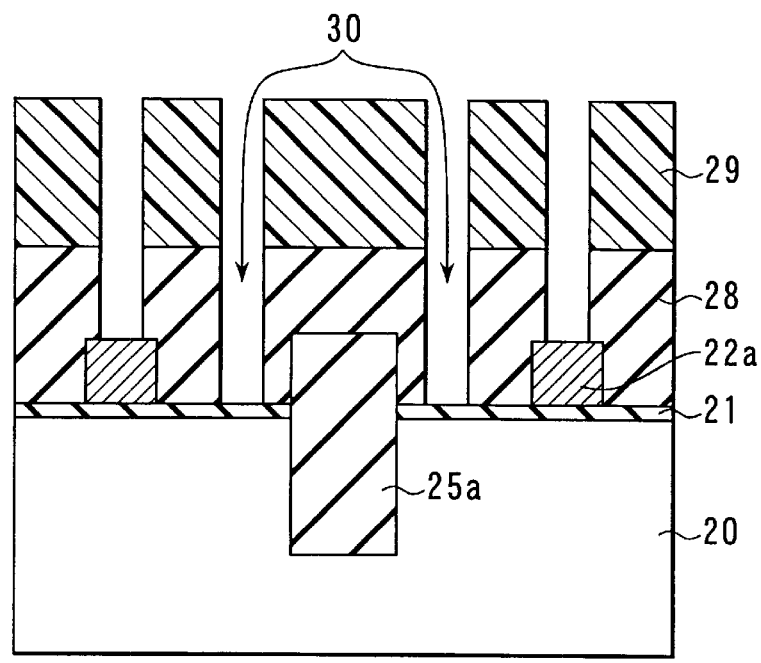
FIG. 15 is a cross sectional view showing the next process step, after the step of FIG. 14, of manufacturing the semiconductor device according to the first embodiment of the invention.

Then, as shown in FIG. 15, a patterned resist 29 is formed on the interlayer insulating film 28. Using the resist 29 as a mask, the interlayer insulating film 28 is selectively etched, thereby forming local interconnection layer forming sections 30. After that, the resist film 29 is removed.

Figure 16:
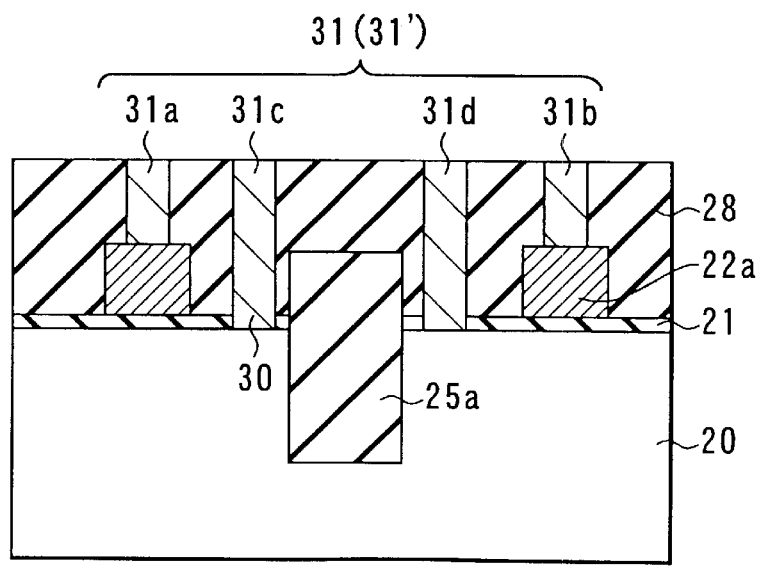
FIG. 16 is a cross sectional view showing the next process step, after the step of FIG. 15, of manufacturing the semiconductor device according to the first embodiment of the invention.

Thereafter, as shown in FIG. 16, a metal film 31' is formed on the entire surface of the resultant structure, and the local interconnection layer forming sections 30 are filled with the metal film. Then, the metal film 31' is etched to thereby expose the top surface of the interlayer insulating film 28. Thus, local interconnection layers 31 are formed in the local interconnection layer forming sections 30. The metal film 31' may be formed of, for example, a high-melting-point metal such as tungsten (W). It is sufficient, however, to use a conductive material to form the metal film.

Figure 17:
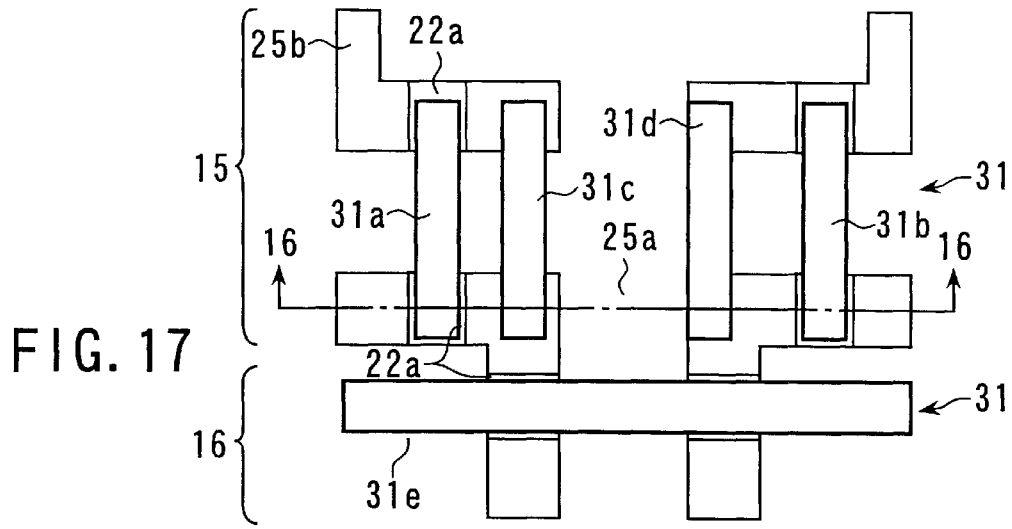
FIG. 17 is a plane view of the structure in FIG. 16, useful in explaining the manufacturing step of FIG. 16.

FIG. 16 is a cross sectional view taken along line 16—16 of FIG. 17. As shown in FIG. 17, a local interconnection section 31 in the inverter section 15 includes gate electrode connecting layers 31a and 31b that connect the gate electrodes 22a to each other, and element area connecting layers 31c and 31d that connect the element areas 25b to each other. Further, a local interconnection section 31 in the transfer section 16 consists of a word line layer 31e that will serve as a word line. Thus, the gate electrodes 22a formed only on the element areas 25b are connected to each other by the local interconnection layers 31a and 31b.

Figure 18:
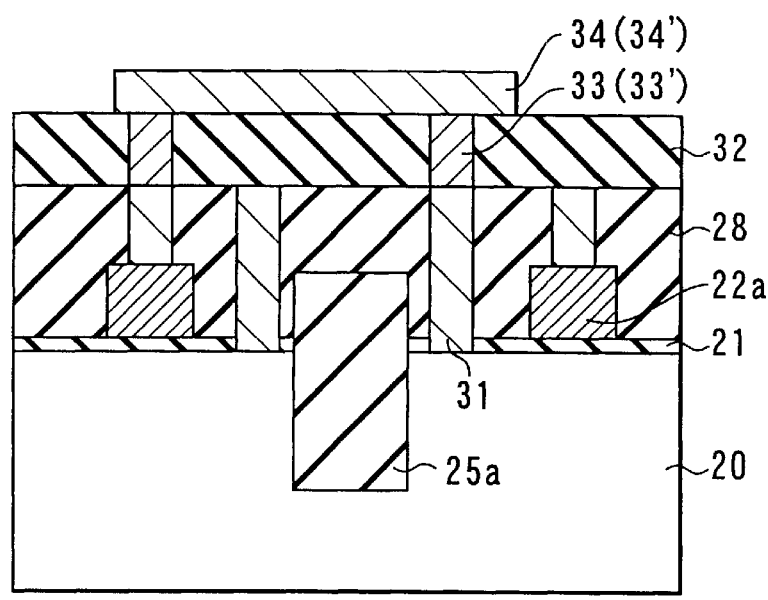
FIG. 18 is a cross sectional view showing the next process step, after the step of FIG. 16, of manufacturing the semiconductor device according to the first embodiment of the invention.

Thereafter, as shown in FIG. 18, an insulating film 32 is formed on the entire surface, and a patterned resist (not shown) is provided on the insulating film 32. A trench is formed, using this resist as a mask. A metal film 33' is formed on the entire surface, and the trench is filled with the metal film 33'. Then, the metal film 33' is selectively removed to expose the top surface of the insulating film 32, thereby forming connecting holes 33. Subsequently, a metal film 34' is formed on the entire surface, and a patterned resist (not shown) is provided on the metal film 34'. The metal film 34' is selectively removed using the resist as a mask, thereby forming wires 34. The metal film 34' for forming the wires 34 is generally formed of, for example, aluminum (Al), tungsten (W), titanium (Ti), titanium nitride (TiN), copper (Cu), tantalum (Ta), tantalum nitride (TaN), tungsten nitride (WN), etc. or formed of laminated metal films made of these metals. The metal film 33' for forming the connection holes 33 is generally formed of, for example, metal film such as tungsten (W), etc. The connection holes 33 and the wires 34 can also be formed simultaneously. This difference in the forming process does not influence the advantages of the invention.

Figure 19:
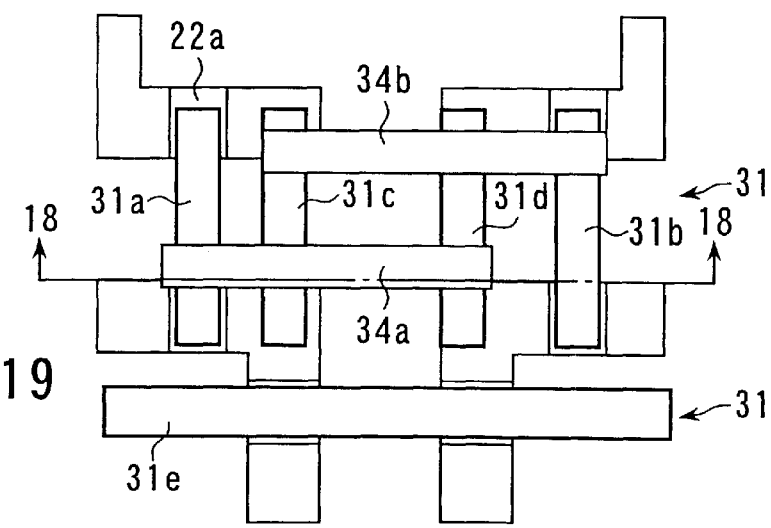
FIG. 19 is a plane view of the structure in FIG. 18, useful in explaining the manufacturing step of FIG. 18.

FIG. 18 is a cross sectional view taken along line 18—18 of FIG. 19. As shown in FIG. 19, the gate electrode connecting layer 31a of the local interconnection section 31 is connected to the element connecting layer 31d by one (34a) of the wires 34, while the gate electrode connecting layer 31b is connected to the element connecting layer 31c by the other (34b) of the wires 34. Thus, the wires 34a and 34b form a cross coupling section of the SRAM memory cell.

After that, the memory cell is accomplished by the usual wire layer forming process. Since this process is well-known, no explanation is given thereof.

Figure 20:
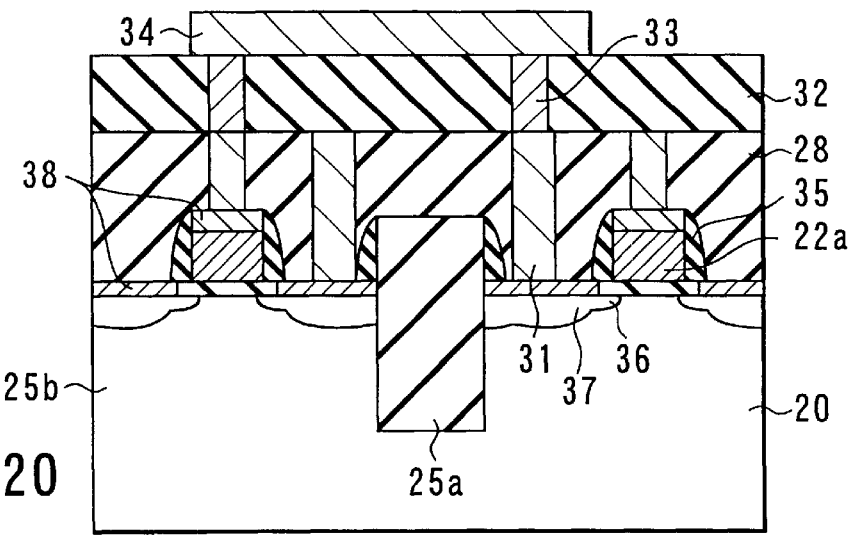
FIG. 20 is a cross sectional view showing another semiconductor device according to the first embodiment.

The first embodiment is not limited to the above-described structure. For example, as shown in FIG. 20, side walls 35 of SiN may be formed on the side surfaces of each gate electrode 22a so as to suppress the short channel effect. Furthermore, in order to prevent degradation of the characteristics due to hot carriers, a low density diffusion area 36 may be formed in that surface portion of each element area 25b, which is overlap each lower edge of a corresponding gate electrode 22a, and also a high density diffusion area 37 having a higher impurity concentration than the area 36 may be formed in surface portions of the element areas 25b in contact with the low density diffusion areas 36, which are overlap opposed edges of the gate electrodes. Moreover, to enhance the performance of the MOSFET, a salicide film 38 may be formed on the gate electrodes 22a, the low density diffusion areas 36 and the high density diffusion areas 37.

In the first embodiment, no description is given of the ion implantation process for forming a well or a channel, or of the source/drain forming process, which is usually executed to form a MOSFET. However, ion implantation for a well and a channel, for example, may be executed before or after forming the gate electrodes 22a. The difference in the time of ion implantation does not degrade the advantages of the invention.

In the first embodiment of the invention, the resist 27 can be simultaneously formed in the inverter section 15 and the transfer section 16 in the process of forming the resist 27 for the gate electrodes 22a. This significantly reduces the difficulty of patterning the resist 27.

Furthermore, since the resist 27 may have a continuous pattern, it is not necessary to consider the fringe of the resist 27. This being so, the influence of the shortening phenomenon due to lithography can be minimized, and accordingly the memory cell size can be reduced.

In addition, the gate electrodes 22a are formed only on the element areas 25b, and not on the element-isolating area 25a. Accordingly, the problem of the gate breakdown voltage degrading when the gate electrode 22a overlaps the trench corner of the element-isolating area 25a, or the problem of kink occurring in the MOS characteristics can be avoided.

Also, since the element-isolating area 25a has a trench structure, elements can be highly integrated.

Moreover, since the polysilicon film 22 forming the gate electrodes 22a is a material different from that of the metal film 31' forming the local interconnection section 31, there is no possibility of degrading the MOSFET characteristics.

Furthermore, as shown in FIG. 16, the element area connecting layers 31c and 31d of the local interconnection section 31 are thicker than the gate electrodes 22a. Accordingly, the gate electrodes can be made to have a low resistance.

As described above, the first embodiment can realize a minute memory cell of a large capacity.

Second Embodiment

A second embodiment of the invention is characterized in that, as in the first embodiment shown in FIGS. 1 and 2, gate electrodes 11 included in an inverter section 15 and a transfer section 16 are formed on only element areas 12, and are connected to each other by local interconnection layers 13. The second embodiment is further characterized in that a damascene process is used.

Concerning a process for manufacturing a semiconductor device according to the second embodiment, a description will be given of only steps that differ from those employed in the first embodiment.

Figure 21:
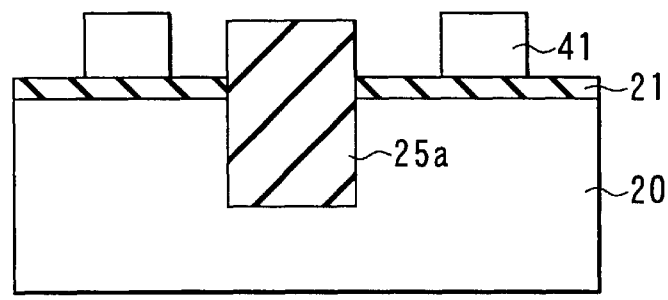
FIG. 21 is a cross sectional view showing a process step of manufacturing a semiconductor device according to a second embodiment of the invention.

First, as shown in FIGS. 5 to 11, a resist 27 is formed in the same manner as in the first embodiment. Subsequently, the polysilicon film 22 is etched, using the resist 27 as a mask, thereby forming dummy gates 41 as shown in FIG. 21.

Figure 22:
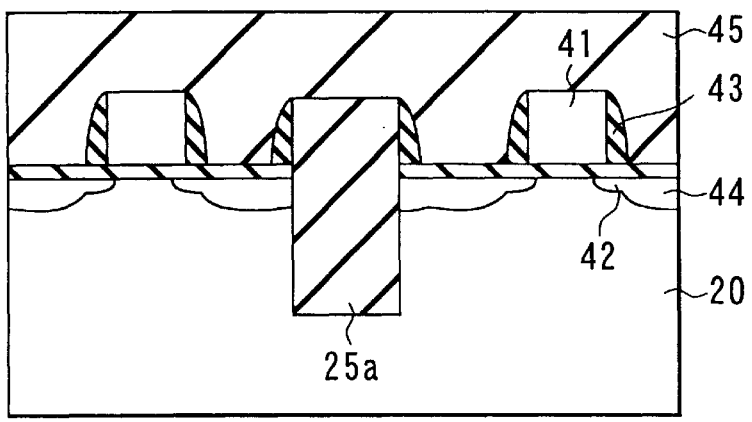
FIG. 22 is a cross sectional view showing the next process step, after the step of FIG. 21, of manufacturing the semiconductor device according to the second embodiment of the invention.

Subsequently, as shown in FIG. 22, low density diffusion areas 42 are formed in the semiconductor substrate 20 by ion implantation. Then, side walls 43 are formed on the side surfaces of the dummy gates 41 and the element-isolating area 25a. After that, high density diffusion areas 44 are formed in the semiconductor substrate 20 by ion implantation. An insulating film 45 is formed on the entire surface of the resultant structure.

Figure 23:
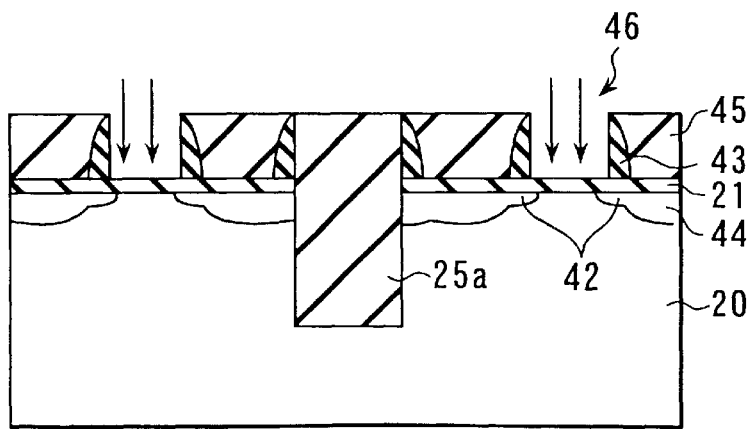
FIG. 23 is a cross sectional view showing the next process step, after the step of FIG. 22, of manufacturing the semiconductor device according to the second embodiment of the invention.

Thereafter, the insulating film 45 is flattened by, for example, CMP, thereby exposing the top surfaces of the dummy gates 41. Then, the dummy gates 41 are removed and openings 46 are formed as shown in FIG. 23. After that, ion implantation is executed, through the openings 46, for forming a channel and setting a threshold voltage.

Figure 24:
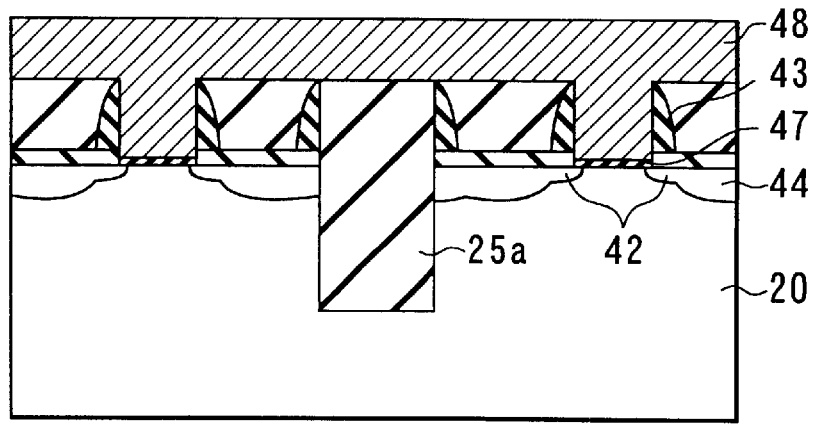
FIG. 24 is a cross sectional view showing the next process step, after the step of FIG. 23, of manufacturing the semiconductor device according to the second embodiment of the invention.

Those portions of the gate insulating film 21, which are exposed through the openings 46, are removed, and new gate insulating films 47 are formed as shown in FIG. 24. The gate insulating films 47 may be formed by a heat treatment executed in the atmosphere of oxygen or of oxygen and nitrogen, as in the conventional case. Alternatively, the film 47 may be formed by, for example, CVD (Chemical Vapor Deposition), or formed of a film of another composition. Specifically, the gate insulating film 47 may be formed of a high dielectric film made of $Ta_2O_5$, $TiO_2$, $ZrO_2$, $HfO_2$, $ZrSiO_4$, $HfSiO_4$, $TiSiO_4$, etc. In other words, it is sufficient if the insulating film 47 contributes to the enhancement of the performance of the MOS transistor.

In the next step, a gate electrode material 48 is formed by, for example, CVD, on the entire surface of the resultant structure. If the gate electrode material 48 is polysilicon or amorphous silicon, ion implantation is executed to introduce an impurity into the gate electrode material 48. The gate electrode material 48 is not limited to silicon, but may consist of a single metal film of W, Ti, or two or more films made of different metals. In other words, it is sufficient if the gate electrode material 48 has a work function that provides a desired threshold value.

Figure 25:
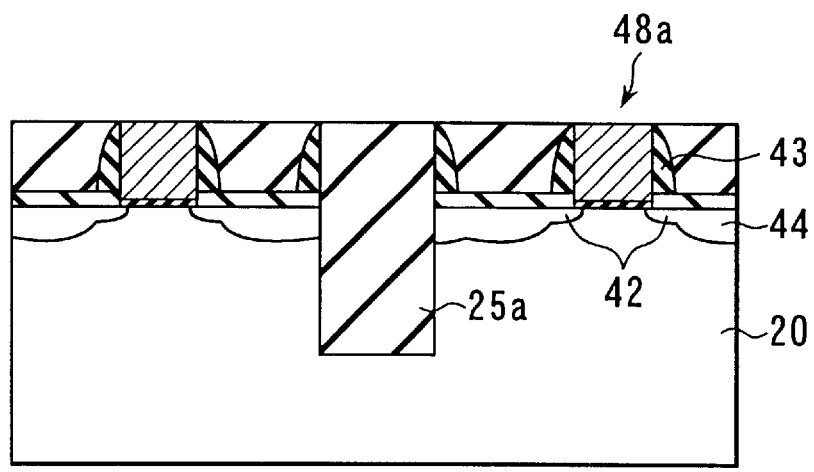
FIG. 25 is a cross sectional view showing the next process step, after the step of FIG. 24, of manufacturing the semiconductor device according to the second embodiment of the invention.

After that, the gate electrode material 48 is flattened by etching back, thereby forming gate electrodes 48a as shown in FIG. 25.

Figure 26:
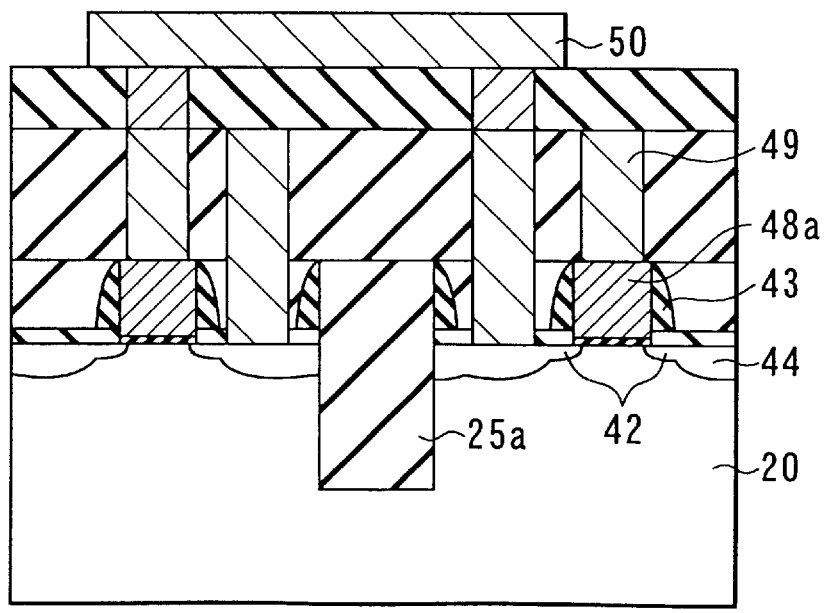
FIG. 26 is a cross sectional view showing the next process step, after the step of FIG. 25, of manufacturing the semiconductor device according to the second embodiment of the invention.

In the next step shown in FIG. 26, local interconnection layers 49 and wires 50 are formed in the same process steps as those shown in FIGS. 14 to 19.

The second embodiment is not limited to the above. For example, to enhance the performance of the MOSFET, a salicide film 38 may be provided as in the first embodiment, as is shown in FIG. 20.

The second embodiment can provide the following advantages, as well as advantages similar to those of the first embodiment.

If channel ion implantation for setting the threshold voltage of the MOSFET is executed before forming the gate insulating film or after patterning the gate electrodes, the following problems will occur.

In the case of executing ion implantation before forming the gate insulating film, channel ion implantation is executed before forming the element-isolating area. Accordingly, the impurity diffuses during heating for forming the element-isolating area, which makes it difficult to obtain a desired threshold value. On the other hand, in the case of executing ion implantation, after forming the gate electrodes, through the gate electrodes, the channel impurity is implanted through the gate insulating film, and hence high implantation energy is required. Further, when implanting an impurity of a great mass, the reliability of the gate insulating film reduces.

In the second embodiment, however, the gate insulating film 47 and the gate electrodes 48a are formed after ion implantation. Accordingly, a desired threshold voltage can be obtained, which enhances the reliability of the gate insulating film.

Moreover, since, in the second embodiment, the gate insulating film 47 is formed after a high heat treatment, which is executed for impurity activation after ion implantation, the gate insulating film 47 can be formed of even a high dielectric film that is weak at a high temperature. Therefore, a MOSFET of a high performance can be formed, even if it must be made to have an extremely small size.

Third Embodiment

A process for manufacturing a semiconductor device, according to a third embodiment, is similar to the process used in the first embodiment, and differs only in a local interconnection layer pattern that differs from a corresponding pattern employed in the first embodiment. Therefore, a description will be given of only the step differing from that employed in the first embodiment, and also given of the different local interconnection layer pattern.

First, as shown in FIGS. 5 to 16, gate electrodes 22a and a local interconnection section 31 are formed as in the first embodiment. The local interconnection section 31 employed in the third embodiment is layout as shown in the plane view of FIG. 27.

Figure 27:
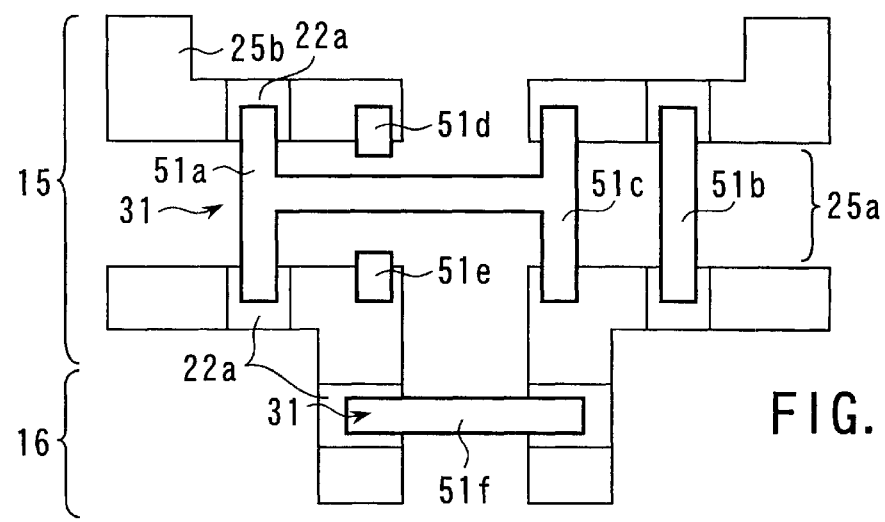
FIG. 27 is a plane view showing a process step for forming local interconnection layers according to a third embodiment.

As shown in FIG. 27, the gate electrodes 22a are formed only on the element areas 25b, and the local interconnection section 31 connects the gate electrodes 22a.

The local interconnection section 31 in the inverter section 15 includes gate electrode connecting layers 51a and 51b that connect the gate electrodes 22a to each other, and element area connecting layers 51c, 51d and 51e that connect the element areas 25b to each other. Further, the local interconnection section 31 in the transfer section 16 consists of a word line layer 51f that will serve as a word line. The element area connecting section 51c is connected to the gate electrode connecting section 51a, while the other element area connecting sections 51d and 51e are isolated.

Figure 28:
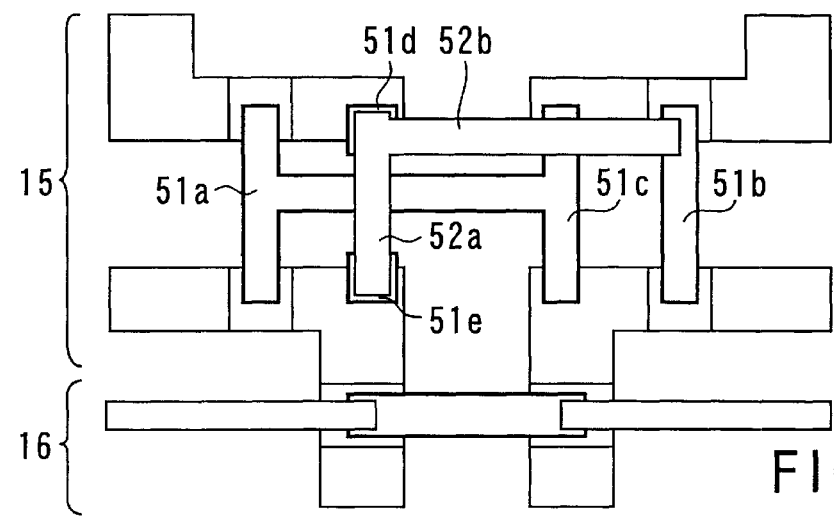
FIG. 28 is a plane view showing a process step for forming wiring according to the third embodiment.

Accordingly, as shown in FIG. 28, the isolated element area connecting section 51d is connected to the other element area connecting section 51e by means of a metal wire 52a, and also to the gate electrode connecting section 51b by means of a metal wire 52b.

Figure 29:
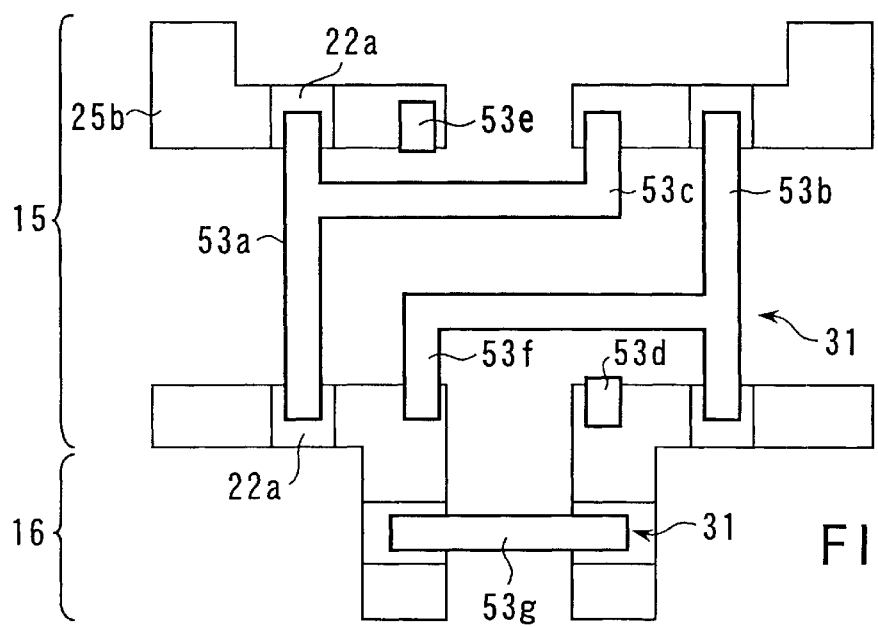
FIG. 29 is a plane view showing a process step for forming other interconnection layers according to the third embodiment.

The local interconnection layer pattern is not limited to that shown in FIG. 27. For example, the pattern may be modified as shown in FIG. 29. In this modification, the local interconnection section 31 in the inverter section 15 includes gate electrode connecting layers 53a and 53b that connect the gate electrodes 22a to each other, and element area connecting layers 53c, 53d, 53e and 53f that connect the element areas 25b to each other. Further, the local interconnection section 31 in the transfer section 16 consists of a word line layer 53g that will serve as a word line. The element area connecting layer 53c is isolated from the element area connecting layer 53d and connected to the gate electrode connecting layer 53a. The element area connecting layer 53f is isolated from the element area connecting layer 53e and connected to the gate electrode connecting layer 53b.

Figure 30:
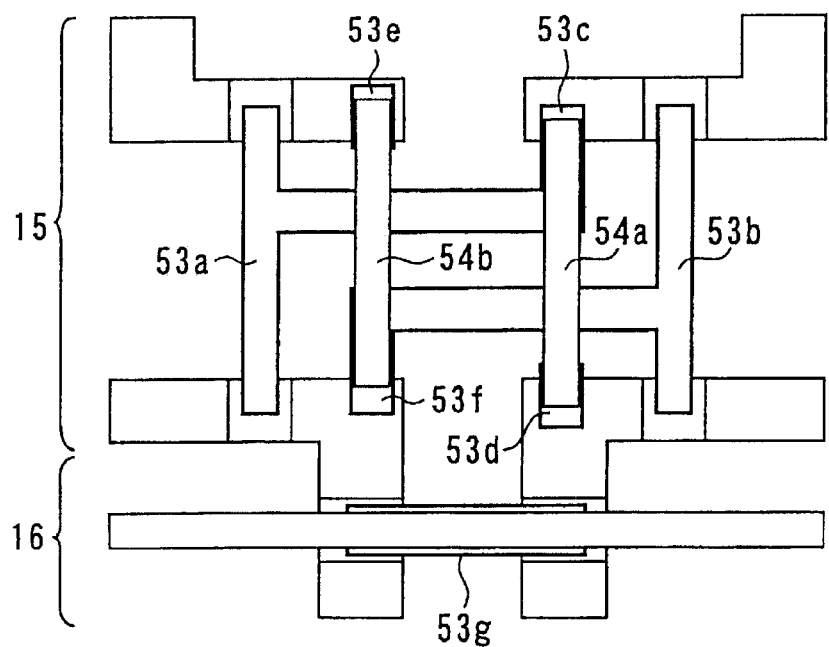
FIG. 30 is a plane view showing a process step for forming other wiring according to the third embodiment.
Figure 31:
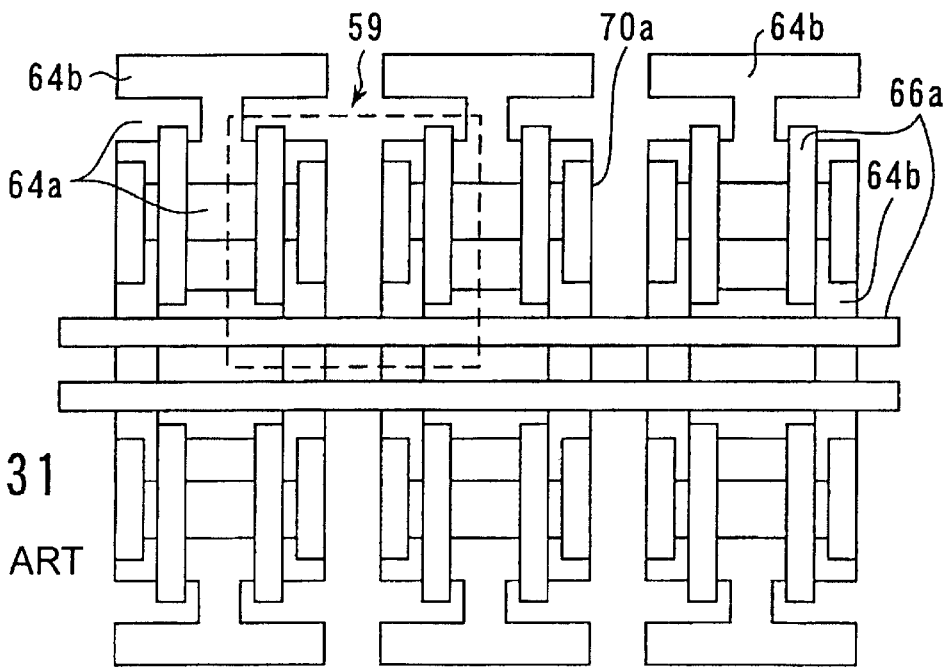
FIG. 31 is a plane view showing a conventional SRAM memory cell array.
Figure 32:
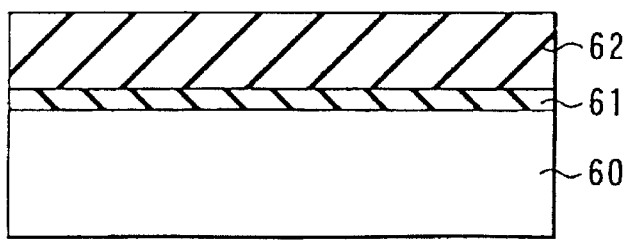
FIG. 32 is a cross sectional view showing a conventional process step of manufacturing a semiconductor device.
Figure 33:
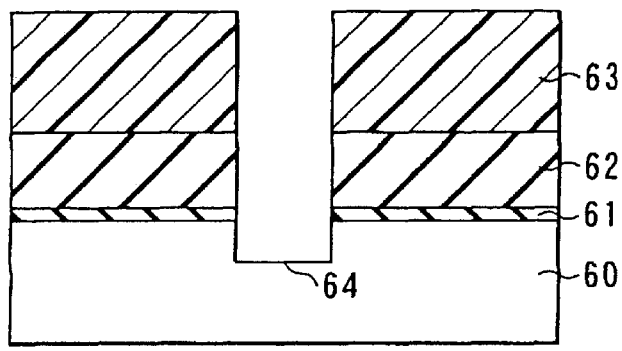
FIG. 33 is a cross sectional view showing the next process step, after the step of FIG. 32, of manufacturing the semiconductor device.
Figure 34:
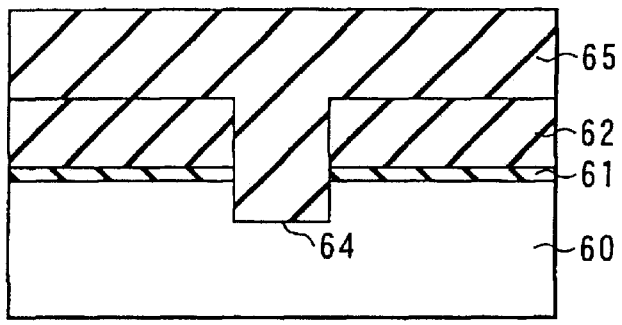
FIG. 34 is a cross sectional view showing the next process step, after the step of FIG. 33, of manufacturing the semiconductor device.
Figure 35:
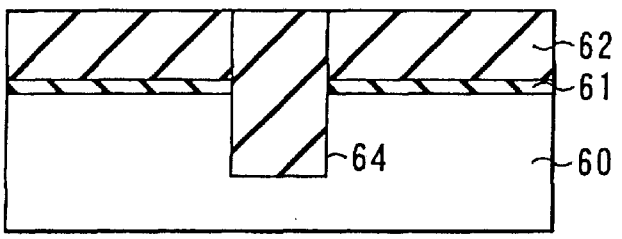
FIG. 35 is a cross sectional view showing the next process step, after the step of FIG. 34, of manufacturing the semiconductor device.
Figure 36:
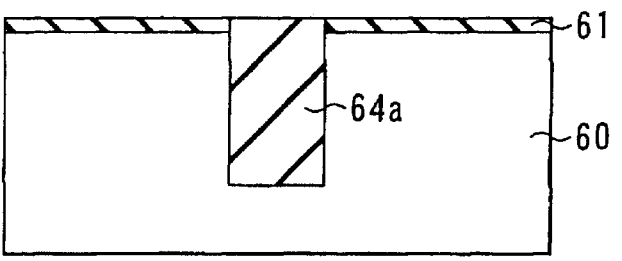
FIG. 36 is a cross sectional view showing the next process step, after the step of FIG. 35, of manufacturing the semiconductor device.
Figure 37:
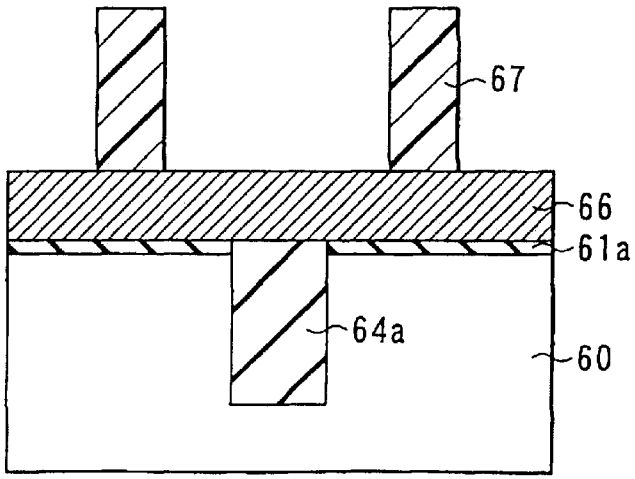
FIG. 37 is a cross sectional view showing the next process step, after the step of FIG. 36, of manufacturing the semiconductor device.
Figure 38:
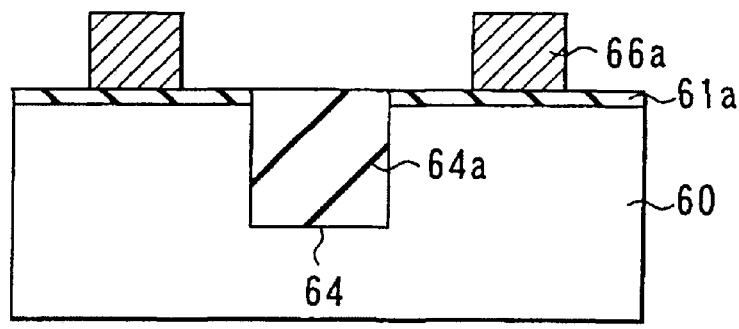
FIG. 38 is a cross sectional view showing the next process step, after the step of FIG. 37, of manufacturing the semiconductor device.
Figure 39:
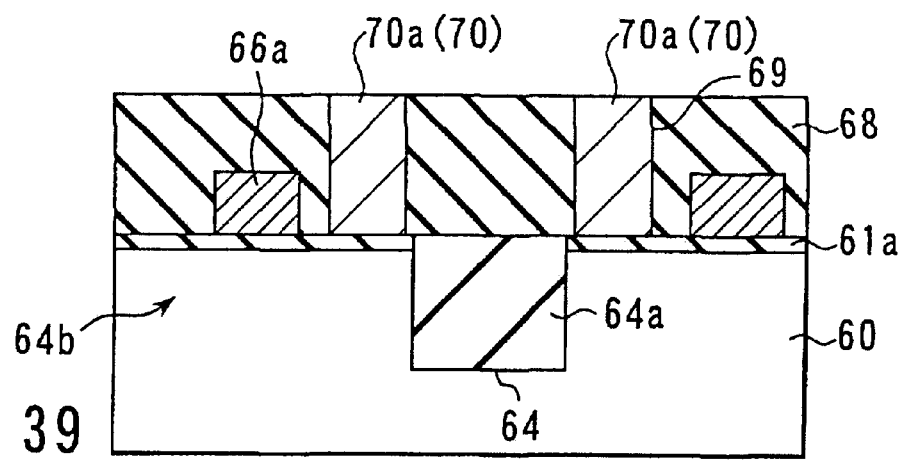
FIG. 39 is a cross sectional view showing the next process step, after the step of FIG. 38, of manufacturing the semiconductor device.
Figure 40:
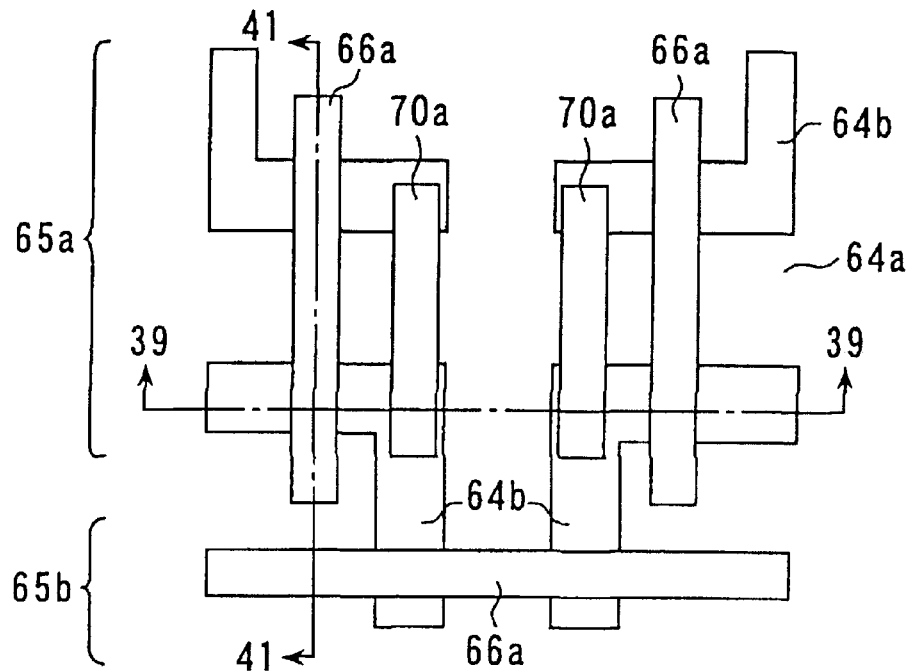
FIG. 40 is a plane view of the structure shown in FIG. 39, useful in explaining the manufacturing step of FIG. 39.
Figure 41:
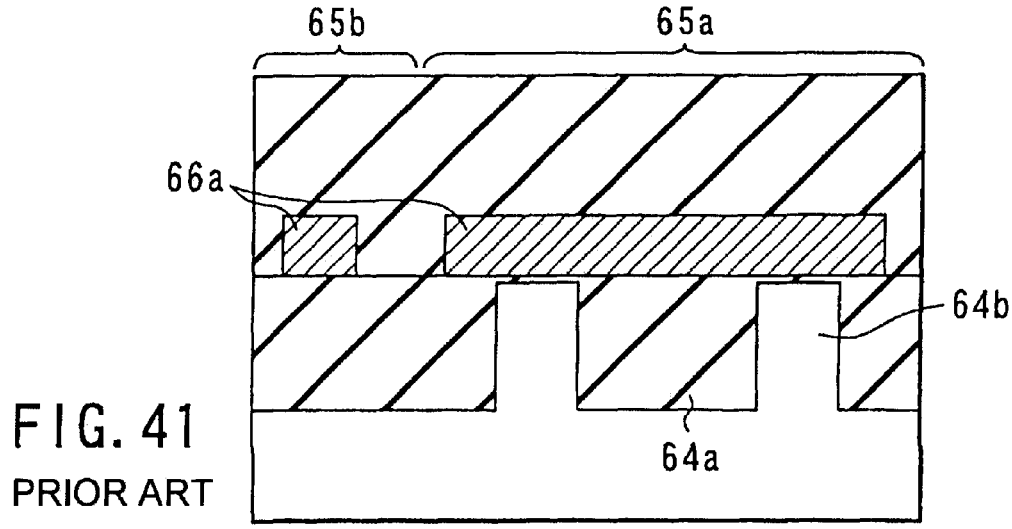
FIG. 41 is a cross sectional view taken along line 41—41 of FIG. 40, showing the conventional semiconductor device.
Figure 42:
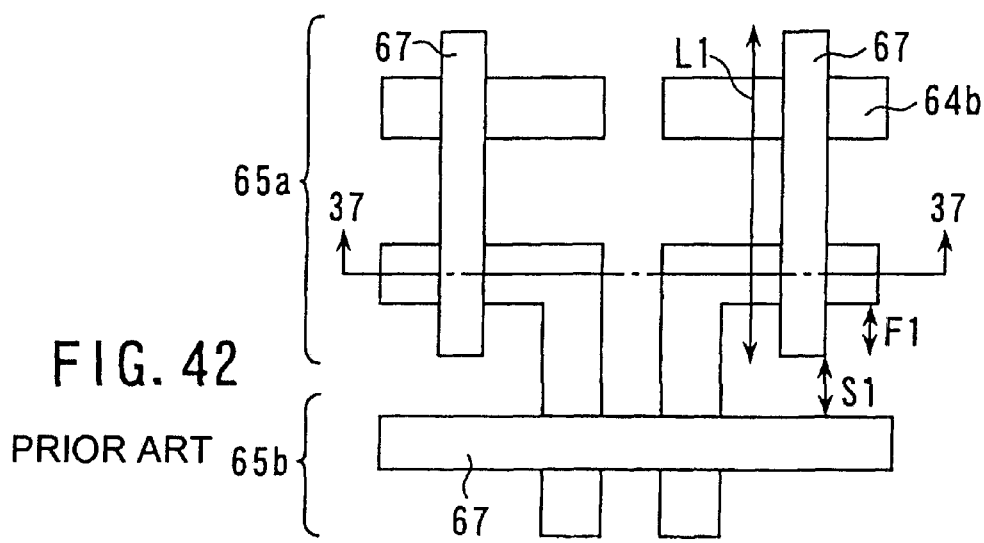
FIG. 42 is a plane view of the structure shown in FIG. 37, useful in explaining the manufacturing step of FIG. 37.
Figure 43:
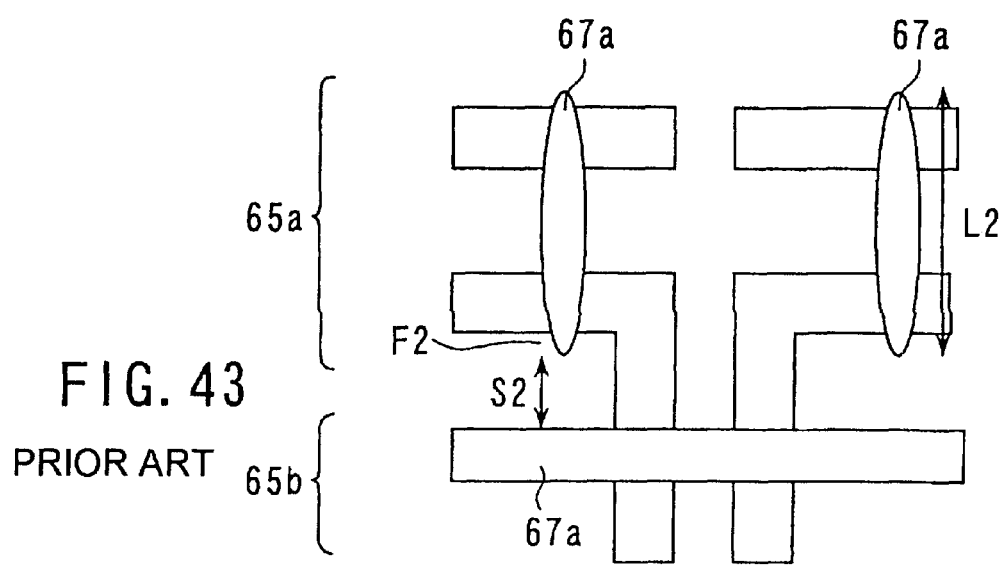
FIG. 43 is a plane view of the structure shown in FIG. 37, useful in explaining the manufacturing step of FIG. 37.

Accordingly, as shown in FIG. 30, the element area connecting layer 53c is connected to the element area connecting layer 53d by means of a metal wire 54a. Further, the element area connecting layer 53f is connected to the element area connecting layer 53e by means of a metal wire 54b.

It is not always necessary to continuously form each of the word line layers 51f and 53g. Each of these word line layers may consist of isolated portions. In this case, it is sufficient if the isolated portions are connected to each other by a wire.

In addition, the process for manufacturing a semiconductor device, according to the third embodiment, is not limited to the inclusion of the process of the first embodiment, but may include, for example, the process of the second embodiment.

The above-described third embodiment can provide the same advantages as the first and second embodiments. Moreover, in the layout of the local interconnection section 31 shown in FIG. 27, only the local interconnection layer, which is located on the element-isolating area 25a and connects the gate electrode connecting layer 51a to the element area connecting layer 51c, is parallel to the word line layer 51f. Therefore, in accordance with the development of element microfabrication, the dimension of a cell in a longitudinal direction (i.e. a direction parallel to the layer 51b) can be reduced by an amount corresponding to a reduction in the width of the element-isolating area 25a. Moreover, since a bit line is formed parallel to the layer 51b, its length can be shortened, which means that the signal delay of the bit line can be reduced and hence high-speed operation can be realized.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
    a first element area formed in a semiconductor substrate;
    a second element area formed in the semiconductor substrate, which is different from the first element area;
    an element-isolating area that isolates the first element area from the second element area;
    a first gate electrode formed only on the first element area;
    a second gate electrode formed only on the second element area;
    a first local wire connecting the first gate electrode to the second gate electrode; and
    a second local wire connecting the first element area to the second element area, and being formed of a metal material.

2. The semiconductor device according to claim 1, further comprising third and fourth local wires that are formed on the first and second element areas, respectively and do not connect the first and second gate electrodes to each other or the first and second element areas to each other, and a wire connecting the third local wire to the fourth local wire.

3. The semiconductor device according to claim 1, further comprising side walls formed on side surfaces of the first and second gate electrodes, respectively.

4. The semiconductor device according to claim 1, further comprising:
a first low density diffusion area formed in a surface portion of the first element area, which overlaps a lower edge portion of the first gate electrode; a first high density diffusion area having a higher impurity concentration than the first low density diffusion area and formed in the surface portion of the first element area in contact with the first low density diffusion area.

5. The semiconductor device according to claim 1, further comprising a silicide film formed on the first and second gate electrodes and the first and second element areas.

6. The semiconductor device according to claim 1, wherein the element-isolating area has a trench structure.

7. The semiconductor device according to claim 1, wherein the first and second gate electrodes are formed of a material different from the material of the first and second local wires.

8. The semiconductor device according to claim 1, wherein the second local wire is thicker than the first and second gate electrodes.

9. A semiconductor device comprising:
a first element area formed in a semiconductor substrate;
a second element area formed in the semiconductor substrate, which is different from the first element area;
an element-isolating area that isolates the first element area from the second element area;
a first-gate electrode formed only on the first element area;
a second gate electrode formed only on the second element area;
a first local wire connecting the first gate electrode to the second gate electrode;
second and third local wires formed on the first and second element areas, respectively, the second and third local wires connecting no first and second gate electrodes to each other or no first and second element areas to each other; and
a wire connecting the second local wire to the third local wire.

10. The semiconductor device according to claim 9, further comprising:
side walls formed on side surfaces of the first and second gate electrodes, respectively.

11. The semiconductor device according to claim 9, further comprising:
a first low density diffusion area formed in a surface portion of the first element area, which overlaps a lower edge portion of the first gate electrodes;
a first high density diffusion area having a higher impurity concentration than the first low density diffusion area, the first high density diffusion area being formed to be in contact with the first low density diffusion area;
a second low density diffusion area formed in a surface portion of the second element area which overlaps a lower edge portion of the second gate electrode; and
a second high density diffusion area having a higher impurity concentration than the second low density diffusion area, the second high density diffusion area being formed to be in contact with the second low density diffusion area.

12. The semiconductor device according to claim 9, further comprising:
a silicide film formed on the first and second gate electrodes and the first and second element areas.

13. The semiconductor device according to claim 9, wherein the element-isolating area has a trench structure.

14. The semiconductor device according to claim 9, wherein the first and second gate electrodes are formed of a material different from the material of the first and second local wires.

15. The semiconductor device according to claim 9, wherein the second local wire is thicker than the first and second gate electrodes.

16. A process of manufacturing a semiconductor device comprising:
forming a gate insulating film on a semiconductor substrate;
forming a gate electrode material on the gate insulating film;
forming an element-isolating area in the semiconductor substrate for isolating first and second element areas from each other;
forming a patterned resist on the gate electrode material;
selectively removing the gate electrode material, using the resist as a mask, thereby forming a first gate electrode only on the gate insulating film, which is located on the first element area and forming a second gate electrode only on the gate insulating film, which is located on the second element area;
removing the resist;
forming an interlayer film on an entire surface of a resultant structure; and
forming first and second local wires in the interlayer film for connecting the first and second gate electrodes to each other and the first and second element areas to each other.

17. The process according to claim 16, further comprising: forming side walls on side surfaces of the first and second gate electrodes.

18. The process according to claim 16, further comprising:
forming a first low density diffusion area in a surface portion of the first element area, which is in contact with a lower edge portion of the first gate electrode and forming a second low density diffusion area in a surface portion of the second element area which is in contact with a lower edge portion of the second gate electrode; and
forming a first high density diffusion area, which has a higher impurity concentration than the first low density diffusion area, in the surface portion of the first element area in contact with the first low density diffusion area and forming a second high density diffusion area which has a higher impurity concentration than the second low density area in the surface portion of the second element area in contact with the second low density diffusion area.

19. The process according to claim 16, further comprising forming a silicide film on the first and second gate electrodes and the first and second element areas.

20. A process of manufacturing a semiconductor device comprising:
forming a gate insulating film on a semiconductor substrate;
forming a dummy gate material on the gate insulating film;
forming an element-isolating area in the semiconductor substrate for isolating element areas from each other;
forming a patterned resist on the dummy gate material;

selectively removing the dummy gate material, using the resist as a mask, thereby forming a plurality of dummy gates only on those portions of the gate insulating film, which are located on the element areas;

removing the resist;

forming a first interlayer film on an entire surface of a resultant structure;

flattening the first interlayer film to expose top surfaces of the dummy gates;

removing the dummy gates to form openings;

implanting ions through the openings;

forming a gate electrode material on an entire surface of a resultant structure and filling the openings;

selectively removing the gate electrode material to expose a top surface of the first interlayer film and form gate electrodes in the openings;

forming a second interlayer film on an entire surface of a resultant structure; and forming local wires in the second interlayer film for connecting the gate electrodes to each other and the element areas to each other.

21. The process according to claim 20, further comprising forming side walls on side surfaces of the gate electrodes.

22. The process according to claim 20, further comprising:

forming low density diffusion areas in those surface portions of each of the element areas, which are overlap respective lower edge portions of the gate electrodes; and forming high density diffusion areas, which have a higher impurity concentration than the low density diffusion areas, in surface portions of the element areas in contact with the low density diffusion areas.

23. The process according to claim 20, further comprising forming a silicide film on the gate electrodes and the element areas.

24. The process according to claim 20, further comprising:

removing, after ion implantation, the gate insulating film from a bottom of each of the openings to expose top surface portions of the semiconductor substrate; and forming again an insulating film on the exposed surface portions of the semiconductor substrate.

25. A semiconductor device comprising:

a first element area formed in a semiconductor substrate of a first region;

a second element area formed in the semiconductor substrate of a second region and being different from the first element area;

an element-isolating area that isolates the first and second element areas from each other;

a first gate electrode formed only on the first element area;

a second gate electrode formed only on the second element area;

a first local wire connecting the first and second gate electrodes to each other; and a second local wire connecting the first and second element areas to each other.

26. The semiconductor device according to claim 25, wherein the first region is an inverter section, the second region is a transfer section, and the semiconductor device is an SRAM.

27. The semiconductor device according to claim 25, further comprising:

third and fourth local wires that are formed on the first and second element areas, respectively and do not connect the first and second gate electrodes or the first and second element areas, and a wire connecting the third local wire to the fourth local wire.

28. The semiconductor device according to claim 25, further comprising side walls formed on side surface of the first and second gate electrodes.

29. The semiconductor device according to claim 25, further comprising:

a first low density diffusion area formed in a surface portion of the first element area, which overlaps a lower edge portion of the first gate electrode;

a first high density diffusion area having a higher impurity concentration than the first low density diffusion area, being formed to be in contact with the first low density diffusion area;

a second low density diffusion area formed in a surface portion of the second element area which overlaps a lower edge portion of the second gate electrode; and a second high density diffusion area having a higher impurity concentration than the second low density diffusion area, the second high density diffusion area being formed to be in contact with the second low density diffusion area.

30. The semiconductor device according to claim 25, further comprising:

a silicide film formed on the first and second gate electrodes and the first and second element areas.

31. The semiconductor device according to claim 25, wherein the element-isolating area has a trench structure.

32. The semiconductor device according to claim 25, wherein the first and second gate electrodes are formed of a material of the first and second wires.

33. The semiconductor device according to claim 25, wherein the second wire is thicker than the first and second gate electrodes.

* * * * *